(12) United States Patent
Kamath

(10) Patent No.: US 10,320,407 B1
(45) Date of Patent: Jun. 11, 2019

(54) LOW POWER SYNCHRONIZATION OF MULTIPLE ANALOG TO DIGITAL CONVERTERS

(71) Applicant: Analog Devices Global Unlimited Company, Hamilton (BM)

(72) Inventor: Narsimh Dilip Kamath, Bangalore (IN)

(73) Assignee: Analog Devices global Unlimited Company, Hamilton (BM)

(*) Notice: Subject to any disclaimer, the term of this patent is extended or adjusted under 35 U.S.C. 154(b) by 0 days.

(21) Appl. No.: 15/890,086

(22) Filed: Feb. 6, 2018

(51) Int. Cl.
| | |
|---|---|
| H03M 1/00 | (2006.01) |
| H03M 1/06 | (2006.01) |
| G06F 3/05 | (2006.01) |
| H03M 1/14 | (2006.01) |

(52) U.S. Cl.
CPC ............ *H03M 1/0624* (2013.01); *G06F 3/05* (2013.01); *H03M 1/145* (2013.01)

(58) Field of Classification Search
CPC .... H03M 1/1215; H03M 1/12; H03M 1/1245; H03M 1/1023; H03M 1/1225; H03M 1/0624; H03M 1/125
USPC ......................................... 341/155, 140–142
See application file for complete search history.

(56) References Cited

U.S. PATENT DOCUMENTS

| | | | | |
|---|---|---|---|---|
| 5,928,345 A * | 7/1999 | Tetzlaff | .................. | G05B 15/02 340/3.5 |
| 6,456,219 B1 * | 9/2002 | Schreiber | .............. | H03M 3/458 341/143 |
| 7,728,753 B2 * | 6/2010 | Taft | ..................... | H03M 1/0624 341/165 |
| 8,392,740 B2 * | 3/2013 | Dewhirst | .................. | G06F 1/12 341/126 |
| 8,478,917 B2 * | 7/2013 | Scott | ................... | G06F 13/4247 710/104 |
| 8,731,002 B2 * | 5/2014 | Pan | ........................ | H04J 3/1605 370/503 |
| 9,806,734 B1 * | 10/2017 | Madan | ................ | H03M 1/1245 |
| 2013/0278295 A1 * | 10/2013 | Kim | .................... | H03M 1/1245 327/105 |
| 2017/0093417 A1 * | 3/2017 | Iwashita | ............. | G06F 13/4247 |

* cited by examiner

*Primary Examiner* — Linh V Nguyen
(74) *Attorney, Agent, or Firm* — Schwegman Lundberg & Woessner, P.A.

(57) ABSTRACT

A system having two or more sensing nodes coupled to a control node using a serial communication channel having separate transmit and receive circuits, where each sensing node includes an ADC circuit and a microcontroller, operation of the ADC circuit in each sensing node is concurrently synchronized by the control node using the transmit circuit (e.g., with respect to the control node) of the serial communication channel. The control node can synchronize operation of two or more ADC circuits in separate sensing nodes without using shared clocks or other control signals.

20 Claims, 6 Drawing Sheets

LOW POWER SYNCHRONIZATION OF MULTIPLE ANALOG TO DIGITAL CONVERTERS

FIELD OF THE DISCLOSURE

This document pertains generally, but not by way of limitation, to electrical circuits, and more particularly, to synchronizing analog to digital converter circuits.

BACKGROUND

Sensing, and other signal processing applications, can use analog to digital converter (ADC) circuits to convert samples of analog signals (e.g., continuous time, and continuous amplitude, voltages and currents) from an analog signal domain to a digital signal domain. Such converted samples can then be processed using various digital signal processing techniques. Some applications can benefit from the use of two or more ADC circuits, such as to concurrently acquire digital samples of two or more analog signals.

SUMMARY OF THE DISCLOSURE

Such applications can include a control node coupled to two or more sensing nodes including respective ADC circuits. The control node can use independent control and clock signals to cause each of the ADC circuits of the two or more sensing nodes to generate digital samples of respective analog signals. Such synchronizing techniques can increase the amount of wires needed to connect disparate components in a sensing system. In high sample rate systems, the additional wiring can cause degraded performance, such as by increasing power consumption and due to signal propagation limitations in transmitting high speed control signals (e.g., degradation of high-speed clock signals).

The present disclosure describes, among other things, a system for synchronizing two or more analog to digital converter circuits. The system can include a first processing circuit, a second processing circuit, and a control circuit coupled to the first processing circuit and to the second processing circuit using a serial communication channel. The control circuit can transmit a trigger pulse to the first processing circuit and to the second processing circuit using the serial communication channel. The trigger pulse can cause the first processing circuit and the second processing circuit to synchronize a counter using the trigger pulse, and to generate one or more digital samples of an analog signal. The trigger pulse can further cause first processing circuit and the second processing circuit to transmit serial data to the control circuit using the serial communication channel. The serial data can include the one or more digital samples and at least one timestamp. The at least one timestamp can be determined using a value of the counter.

The present disclosure further describes, among other things, a system for synchronizing two or more analog to digital converter circuits. The system can include two or more electrode pods. An individual electrode pod can, where each of the two or more electrode pods comprises a first processing circuit and an analog to digital converter circuit. The first processing circuit to can receive a trigger pulse from a transmit circuit of a serial communication channel, synchronize a counter after receiving the trigger pulse, and generate, using the analog to digital converter circuit, one or more digital samples of the analog signal. The first processing circuit to can then associate at least one timestamp with the one or more digital samples, where the at least one timestamp is determined using at least one value of the counter. The first processing circuit to can then transmit the one or more digital samples and the at least one timestamp to the serial communication channel. The system can also include a belt unit comprising a second processing circuit, the second processing circuit. The second processing circuit can transmit the trigger pulse to the serial communication channel, receive, after transmitting the serial pulse, where the one or more digital samples and the at least one timestamp from the two or more electrode pods using the serial communication channel. The second processing circuit can then synchronize the received one or more digital samples using the at least one timestamp.

The present disclosure is additionally based on the recognition that a method of synchronizing two or more analog to digital converter circuits can include transmitting a trigger pulse to a first processing circuit and to a second processing circuit using a serial communication channel. The trigger pulse can cause the first processing circuit and the second processing circuit to synchronize a counter to the trigger pulse, generate one or more digital samples of the analog signal, and transmit serial data to the control circuit using the serial communication channel. The serial data can include the one or more digital samples and at least one timestamp, where the at least one timestamp is determined using a value of the counter. The method can further include receiving, after transmitting the trigger pulse, the serial data transmitted by the first processing circuit and the second processing circuit. The method can additionally include synchronizing a first part of the serial data with a second part of the serial data using the at least one timestamp, where the first part of the serial data is received from the first processing circuit, and the second part of the serial data is received from the second processing circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure is based on the recognition that, in a system having two or more sensing nodes coupled to a control node using a serial communication channel having separate transmit and receive circuits, such that each sensing node includes an ADC circuit and a microcontroller, operation of the ADC circuit in each sensing node can be concurrently synchronized by the control node, such as by using the transmit circuit (e.g., with respect to the control node) of the serial communication channel. The present disclosure provides techniques for using a control node to synchronize operation of two or more ADC circuits in separate sensing nodes without using shared clocks or other control signals. Such techniques can reduce wire count and power consumption in certain systems, as compared to other techniques.

In sensing or data acquisition system, two or more analog signals can be sampled, such as by two or more processing circuits coupled to two or more analog to digital converter (ADC) circuits. The sensing or data acquisition system can include a control circuit coupled to each of the two or more processing circuits using a serial communication channel. The control circuit can synchronize operation of the two or more ADC circuits by transmitting a trigger pulse to the two or more processing circuits using the serial communication channel. The trigger pulse can cause the two or more processing circuits to synchronize a counter or a timer associated each processing circuit. The trigger pulse can also cause each processing circuit to generate one or more digital samples of an analog signal. The two or more processing circuits can then transmit the digital samples in serial data to the control circuit, such as by using the serial communication channel. Such serial data can include the digital samples and at least one timestamp. The timestamp can be determined using a counter or timer. Such counter or timer can be synchronized to the trigger pulse. The control circuit can receive the serial data, such as to synchronize a first part of the serial data with a second part of the serial data using the at least one timestamp, such first part of the serial data being received from the first processing circuit of the two or more processing circuits, and such second part of the serial data being received from the second processing circuit of the two or more processing circuits.

Figure 1:
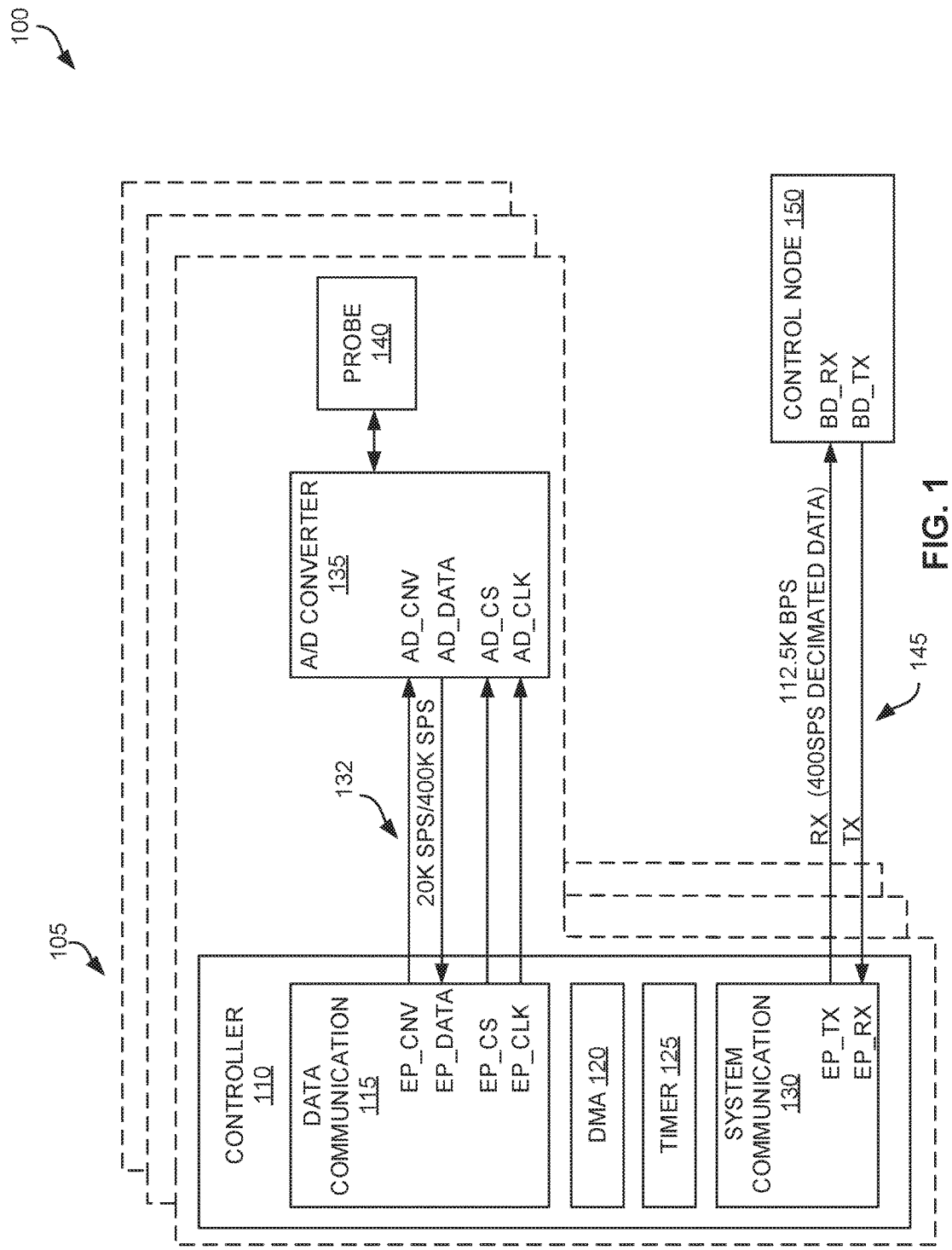
FIG. 1 depicts a block diagram of components of an example of a system for synchronizing of two or more analog to digital converter circuits.

FIG. 1 depicts a block diagram of components of an example of a system 100 for synchronizing two or more analog to digital converter circuits (ADCs). The system 100 can include two or more sensing nodes 105 and a control node 150. The system 100 can also include a system serial communication channel 145 (e.g., a serial communication channel), such as to couple the control node 150 to the two or more sensing nodes 105.

The two or more sensing nodes 105 can each include a controller circuit 110 (e.g., a processing circuit), an ADC circuit 135, and probe component 140. The controller circuit 110 can be coupled to the ADC circuit 135, such as using data communication channel 132 (e.g., a serial data communication channel). The controller circuit 110, the ADC circuit 135, and the probe 140 can be included in a single device package of each of the two or more sensing nodes 105.

The ADC circuit 135 can include an ADC circuit having a control signal (e.g., AD_CNV), such as to initialize the sampling of an analog signal, such as to trigger the conversion of the analog samples to digital samples. Such ADC circuit 135 can include a successive approximation (SAR) ADC circuit having a convert pin, such as to control the timing of sampling of an analog signal. Such a convert pin can be used to synchronize the operation of SAR ADC circuits.

The probe component 140 can include an interface to one or more sensors or other electronic devices for sensing physical phenomena. Such electronic devices can include one or more acoustic, mechanical, optical, electromagnetic, or thermoelectric sensors. Such interface can include one or more buffer, amplifier, or other signal conditioning circuits for conditioning an analog signal received from the one or more electronic devices, such as to enable the analog signal to be sampled and converted to a digital signal domain. Such interface can also include the one or more sensors or other electronic devices.

The controller 110 can include a computing device such as a micro controller, a field programmable gate array, microprocessor, or an application specific integrated circuit (ASIC). Such computing device can include a data communication interface 115, a direct memory access (DMA) component 120, a timer 125, and a system communication interface 130. In some sensing nodes 105, the components of the controller 110 can be included in single integrated circuit. In other sensing nodes 105, two or more components of the controller 110 can be separately located in two or more integrated circuits.

The data communication interface 115 can include a serial communication port and supporting circuitry (e.g., one or more configuration registers, latches, or timing and conditioning circuits, or combination of these), such as a Serial Peripheral Interface or a Synchronous Peripheral Port. The controller 110 can configure the data communication interface 115 and DMA component 120 to interface with the ADC circuit 135, such as to cause the ADC circuit to generate, and transmit to the controller, a specified number of digital samples of an analog signal. Such configuration can cause the data communication interface 115 to actuate clock (EP_CLK) and chip-select (EP_CS) pins of the controller 110 to operate the ADC circuit 135. Such configuration can also actuate a convert signal (e.g., EP_CNV) on the controller 110 to trigger the ADC circuit 135 to convert a sample of an analog signal to a digital sample. The digital sample can be transmitted to the controller 110 such as using data communication channel 132. Such digital samples can be stored or accumulated in a memory circuit, such as can be associated with a configuration of the DMA 120.

The data communication channel 132 can be configured to transmit data at a specified data rate. Similarly, the ADC circuit 135 can be configured to sample an analog signal at a specified sample rate, such as at 20,000 samples per second (SPS) or 400,000 SPS. The sample rate can be selected as a function of the data rate and the sampling application (e.g., such as based on one or more characteristics of the analog signal sampled by the system 100).

The timer 125 can include a hardware timing circuit, such as a real-time clock circuit. The timer 125 can also include software (e.g., a software based timer or counter), which can be updated in response to a hardware timing circuit. The timer 125 can be configured to operate while the controller 110 is in a sleep, hibernate, shutdown, or other low power operating mode. Such timer 125 can be associated with one or more registers or other memory circuit, such as to store a running timer value or timer count. Such timer 125 can also include an input capture feature, such as to store a copy or snapshot of the running timer value in response to an event, such as an interrupt triggered by a device external to the controller 110.

System communication interface 130 can include an interface to a system serial communication channel 145, such as a recommended standard 232 (RS232) serial bus. Such system serial communication channel 145 can transmit a signal from the control node 150 to each sensing node 105, such as using a transmit wire (e.g., such as can be included in or coupled to a transmit circuit TX). Such system serial communication channel 145 can also transmit a signal from each sensing node 105 to the control node 150 using a receive wire (e.g., such as can be included in or coupled to a receive circuit RX). The system communication interface 130 can include a serial receive input/output (I/O) pin coupled to a transmit wire, such as to receive one or more trigger pulses, or one or more other signals, such as can be transmitted from the control node 150. The system communication interface 130 can also include a serial transmit I/O pin, such as coupled to the receive wire, such as to transmit serial data (e.g., digital samples of an analog signal) or one or more other signals, to the control node 150. The receive I/O pin and the transmit I/O pin of each of the two more sensing nodes 105 can be coupled, respectively, to the same transmit and receive lines of the system serial communication channel 145.

The controller 110 of each sensing node 105 can be configured to generate a processing event (e.g., a processor interrupt), such as in response to receiving a trigger pulse (e.g., a series on one or more pulses) from the control node 150, such as via the transmit line of the system serial communication channel. The controller 110 of each sensing node 105 can receive the trigger pulse at substantially the same time, such as to cause each sensing node to generate processing events at substantially the times. Such a processing events can cause the controller 110 to call an interrupt service routine (ISR), or to execute one or more other operations, such as to initiate synchronized sampling of an analog signal.

Such synchronized sampling can include synchronizing timer 125 with the trigger pulse, such as by causing the controller 110 to store an initial value of the timer 125 in a memory storage circuit. The initial value can include a count (e.g., a number of timer ticks) or value of the timer 125. The initial value can also be another value derived from the value of the timer 125. The initial value can be used generate a timestamp for one or more digital data samples received from ADC 135, such as to indicate a time, relative to the initial value, at which the samples were captured. Such timestamps can include a timer count (e.g., a difference between initial timer value and a value of the timer at a time the sample was captured). Such timestamps can also include another value or indicator derived from the initial timer value or a subsequent value of timer 125, such as to indicate an amount of time elapsed after the controller 110 received a trigger pulse from the control node 150. Such timestamps can also include a value or other indicator to indicate the number of ADC samples that have been captured after the controller 110 received a trigger pulse from the control node 150. The stored initial value can be used to synchronize the timer 125 of each sensing node 105 with the received trigger pulse, such as to enable each controller 110 to track, or to determine, an amount of elapsed time after receiving the trigger pulse.

Initiating a synchronized sampling of an analog signal after each sensing node 105 receives the trigger pulse can also include causing the controller 110 of each sensing node 105 to execute one or more operations to configure the data communication interface 115 and the DMA component 120. This, in turn, can cause the ADC circuit 135 to generate digital samples of the analog signal, such as described herein. Such operations can also cause each controller 110 to record a timestamp to associate with the generated digital samples.

Initializing a synchronized sampling of an analog signal after each sensing node 105 receives the trigger pulse can also include causing the controller 110 of each sensing node 105 to execute one or more operations to check a current value of the running timer, such as to determine whether the sensing node is drifting away from an initial synchronization, such as to execute operations to compensate for the drift. The drift can occur due to small difference in accuracy of the clock sources used in each sensing node. For example, the control node 150 can send a first trigger pulse, or sequence of pulses, to the sensing nodes 105. The sensing nodes 105 can determine that these are the first trigger pulses transmitted by the control node 105 and set their respective timer counts to a pre-determined value.

The sensing nodes 105, upon receiving subsequent trigger pulses from the control node 105, can compare the current timer value to an expected timer value. The 'expected' timer value (or expected offset in timer value from the previous trigger) can be pre-determined for a given system 100 according an ideal clock source, or based on a predetermined interval between trigger pulses. The interval between subsequent triggers can be determined based on a specification for maximum skew between sampling of the ADC(s) in the different sensing nodes 105. The interval between subsequent triggers can also be determined based on the accuracy specification of the clock sources an oscillator or crystal) in the sensing nodes 105.

If the current value of the running timer (or offset in timer count value from the previous trigger) is different from the expected timer value, the sensing nodes 105 can adjust the configuration of the data communication interface 115 and the DMA component 120, such as to change the timing of when the ADC circuit 135 generates digital samples of the analog signal. For example, when the current value of the running timer is greater than the expected time value, the sensing nodes 105 can compensate for this by delaying actuation of the EP_CNV signal in time by re-configuring the data communication interface (115) slightly later in time. When the current timer value of the running timer is less than the expected timer value, the sensing nodes 105 can compensate for this by speeding up, or pulling in, the EP_CNV pulses in time by re-configuring the data communication interface slightly earlier in time. This shift in time can be accomplished with the use of another counter.

The elapsed time between a controller 110 receiving a trigger pulse and the controller triggering the ADC circuit 135 to generate the digital samples can be deterministic for each sensing node 105. Consequently, synchronizing the timer 125 of each sensing node 105 to the trigger pulse, and triggering the ADC circuit 135 of each sensing node, such as described herein, can cause the ADC circuits to operate synchronously, such as to synchronously generate one or more digital samples of one or more corresponding analog signals. Once the ADC circuits have been synchronized using the trigger pulse, each sensing node can continue to generate digital samples, such as in response to one or more other events, such as in response to the expiration of a timer or the reception of a signal from an external source.

The system communication channel 145 can be configured to transmit data at a lower rate than the data communication channel 132, such as to enable the system serial communication channel to transmit data between devices separated by a longer distance than a distance separating devices connected by the data communication channel, or to comply with other physical limitations of the system communication channel.

Each controller 110 can be configured with one or more circuits or software components to convert (e.g., decimate) the digital samples captured at the data sample rate to a lower sample rate. This can help reduce the amount of data transmitted over the system communication channel 145. The sample rate of the digital samples can be reduced using a finite impulse response (FIR) filter. Such an FIR filter can include an 80-tap filter configured to operate on a window of 256 data samples. This can be used to decimate a data set of digital samples (e.g., 512 digital samples) sampled at a rate of 20 K SPS, such as to generate a data set of digital samples having a sample rate of 400 SPS. Such an FIR filter can also include a 4-tap filter configured to operate on a window of 256 data samples, such as to decimate a data set of digital samples (e.g., 1024 digital samples) sampled at a rate of 400 K SPS to generate a data set of digital samples having a sample rate of 400 SPS. Other FIR filters, or other sample rate conversion techniques, can be used to change the sample rate of the digital samples received from an individual ADC circuit 135. The decimated digital samples can be transmitted to the control node 150. Such transmitting can include attaching a timestamp, using a specified indicator, to the decimated digital samples. Then, the decimated data and timestamp can be transmitted to the control unit 150, such as in a serial data packet, such as using the system communication channel 145.

The control node 150 can include a processing circuit (not shown) to receive the digital samples and associated timestamps transmitted by each sensing node 105. The control node 150 can receive digital samples that were captured at different times in an arbitrary sequence due to a single trigger pulse causing the two or more sensing nodes 105 to continuously generate digital samples and due to certain arbitration techniques used to enable the two or more sensing nodes 105 to share the same system serial communication channel 145. The digital samples can be received in a different sequence than the sequence in which they were generated. The control node 150 can use the timestamps associated with the digital samples to synchronize the digital samples. Such synchronizing can include grouping or ordering or sequencing the digital samples in a sequence according to their associated timestamps.

Figure 2A:
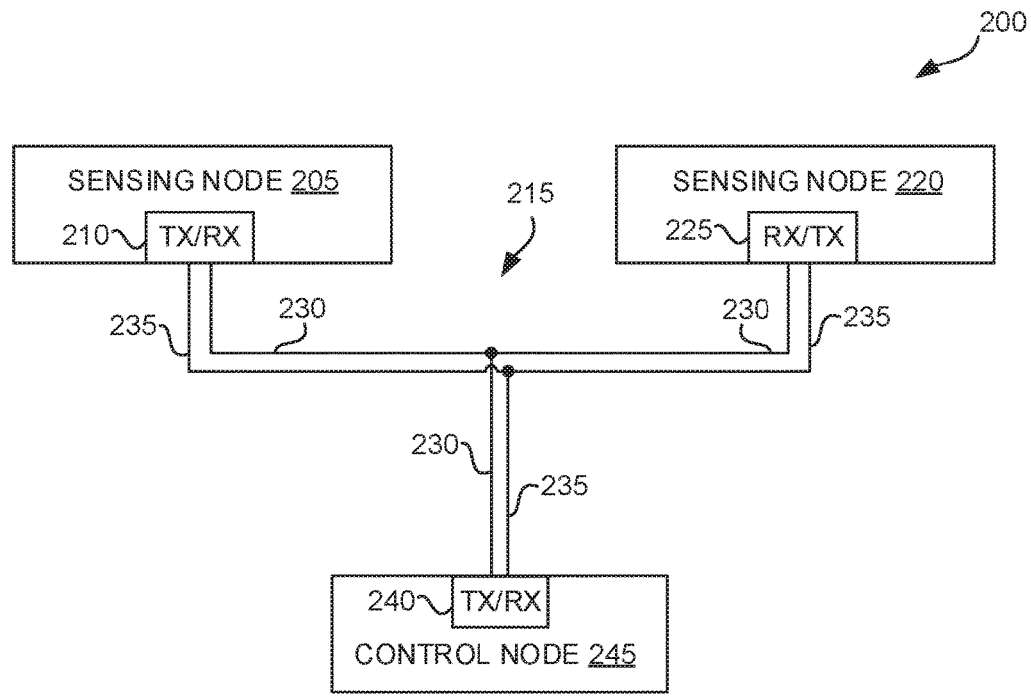
FIG. 2A depicts a block diagram of an example of a system for synchronizing two or more analog to digital converter circuits.

FIG. 2A depicts a block diagram of an example of a system 200 for synchronizing two or more analog to digital converter circuits. Such system 200 can be an example of the system 100 (FIG. 1). Such system 100 can include a sensing node 205 and a sensing node 220, such that each sensing node can be coupled to a control node 245 such as using a system communication channel 215 (e.g., a serial communication channel). The sensing node 205 and the sensing node 220 can be examples of the one or more sensing nodes 105 (FIG. 1), while the control node 245 can be an example of the control node 150 (FIG. 1).

The system communication channel 215 can be an example of the system communication channel 145 (FIG. 1). The system communication channel 215 can include a two-wire communication channel, such as can have separate transmit and receive circuits, such as can be provided using certain configurations of an RS232 serial communication channel. Such a two-wire communication channel can include a transmit wire 230 that can be coupled to a transmit pin on a system communication interface 240 of the control node 245 and to receive pins of system communication interfaces 210 and 225 of the sensing node 205 and the sensing node 220. Such coupling can enable the control node to transmit trigger pulses to the sensing nodes. Such a two-wire communication channel can also include a receive wire 230 that can be coupled to a receive pin on a system communication interface 240 of the control node 245 and to transmit pins of system communication interfaces 210 and 225 of the sensing node 205 and the sensing node 220. Such coupling can enable the sensing nodes to transmit digital samples to the control node.

The control node 245 can transmit a trigger pulse using the transmit line 230. This can cause the sensing node 205 and the sensing node 220 to receive the trigger pulse at substantially the same time, or within a threshold time difference. The received trigger pulse can cause a processing event (e.g., an interrupt) in a controller, or other processing circuit, of the sensing node 205 and the sensing node 220. Such a processing event can cause each sensing node 205, 220 to synchronize respective internal timers with the occurrence of the trigger pulse, and to trigger respective ADC circuits associated with each sensing node 205, 220 to begin synchronously generating digital samples of an analog signal, such as described herein. The digital samples can be stored by each sensing node, can be decimated, can be associated with a timestamp, and can be transmitted to the control node 240 such as using the receive line 235. The control node 240 can then sequence or order the digital samples based on their associated timestamps, such as to execute further processing operations on the digital samples.

The system 200 can use the control node 245 to synchronize the operation of ADC circuits in separate sensing nodes 205 and 220, such as by using a serial communication channel for both synchronization and data communication. Such synchronization can be accomplished without requiring the use of a separate clock signals or other signal wires coupling the control node 245 to the sensing nodes 205 and 220. Such synchronization can also be accomplished using a trigger pulse, such as to avoid multiple transmissions that may be required by other synchronization techniques. Such trigger pulses can trigger the ADC circuits to generate one or more digital samples, such as to further reduce communication overhead. When the operation of the ADC circuits of the sensing nodes 205 and 220 are controlled by DMA components of the sensing nodes (e.g., DMA component 120 of FIG. 1), the system 200 can conserve power by enabling the controller of each sensing node to accumulate digital samples while remaining in a low power operating mode (e.g., a sleep or a hibernation mode). Such power conservation can be obtained due to the controllers in the sensing nodes not having to remain in, or not having to transition to, a normal (e.g., higher power) operating mode to service processing events caused by trigger pulses issued to generate each digital sample.

Figure 2B:
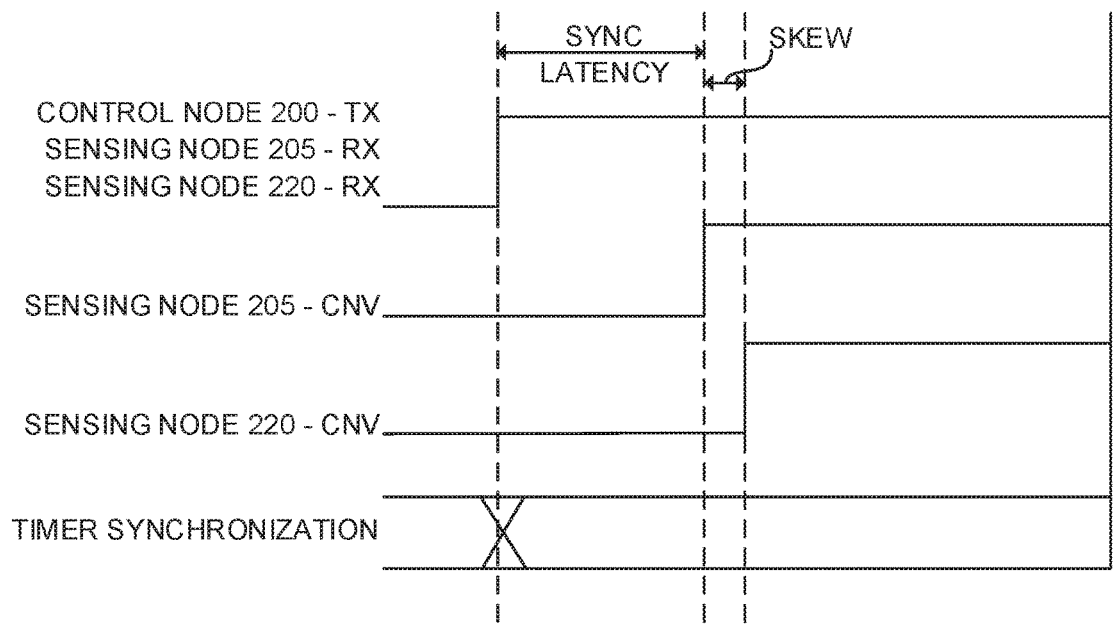
FIG. 2B depicts an example of a timing diagram of a system for synchronizing two or more analog to digital converter circuits.

FIG. 2B depicts an example of a timing diagram of a system for synchronizing two or more analog to digital converters. The timing diagram can illustrate a relationship between signals transmitted by a control node, such as the control node 245, and signals received, and generated by, two or more sensing nodes, such as the sensing node 205 and the sensing node 220. More specifically, the timing diagram shows that, while each sensing node can receive a trigger pulse at substantially the same time, there can be a finite time difference (e.g., a timing skew) between each sensing node triggering its associated ADC circuit to generate a digital sample. Such finite time differences can be determinable, such as by simulation or other experimentation. Such finite time differences can therefore be accounted for, such as by using software timing delays, such as to enable each sensing node to cause its associated ADC circuit to concurrently generate digital samples of analog signals, such as by delaying or speeding up actuation of a control signal (e.g. EP_CNV) to cause ADCs to generate digital samples.

Figure 3:
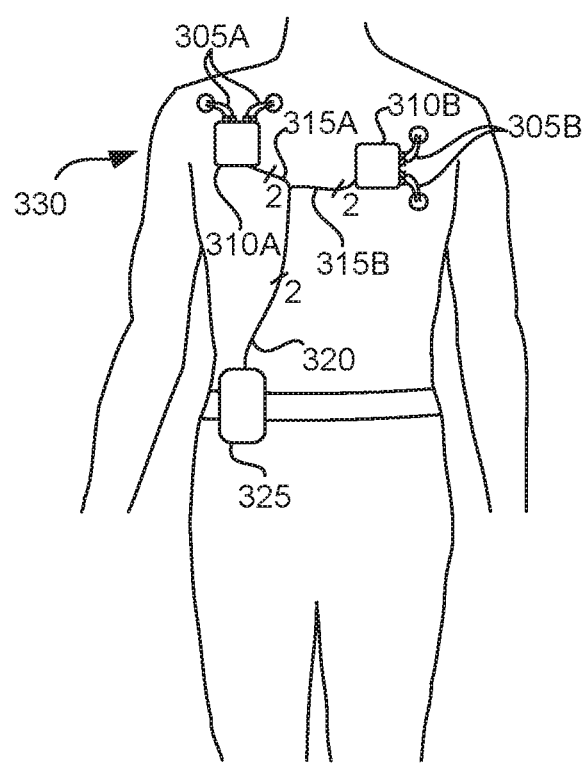
FIG. 3 depicts a block diagram of an example of a sensing application of a system for synchronizing two or more analog to digital converter circuits.

FIG. 3 depicts a block diagram of an example of a sensing application of a system for synchronizing two or more analog to digital converter circuits. Such system can include a sensing node 310A (e.g., a first electrode pod), a sensing node 310B (e.g., a second electrode pod), and a control node 325 (e.g., a belt unit). Such system can be an example of the system 200 (FIG. 2), such that the sensing nodes 310A and 310B correspond to sensing nodes 205 and 220, while the control node 325 correspond to control node 245. Such system can be an example of a sensing system that can be operated to cause the sensing node 310A and the sensing node 310B to sample respective analog signals, such as respective biological signals generated by the subject 330. Such biological signals can include indicators of neurological, cardio vascular, respiratory activity, or other biological activity. The sensing system can be further operated to cause the control node 325 to synchronize operation of ADC circuits in the sensing node 310A and the sensing node 310B, such as to cause the sensing nodes to synchronously sample and digitize biological signals of the subject 330.

The sensing node 310A and the sensing node 310B can be associated with one or more sensing node 305A and 305B, respectively. The one or more sensing node 305A and 305B can include a probe, sensor, or other transducer. Such sensing nodes can detect information about physical phenomena and can provide such information to their associated sensing node as an analog signal. Such sensing nodes, for example, can detect information about neurological activity in the subject 330 (e.g., the propagation of an action potential traveling along, or between, nerve cells). Such information can be transmitted (e.g., conducted) to the first sensing node 310A as an analog voltage.

The control node 325 can be coupled to the sensing node 310A and to the sensing node 310B using a system communication channel 320, such as to transmit trigger pulses to each sensing node and to receive digital samples from each sensing node, such as described herein. Such trigger pulses can be used to synchronize the operations of the first sensing node 305A and to the second sensing node 310B, such as described herein. The system communication channel 320 can be an example of the system communication channel 145 (FIG. 1). Connection 315A and connection 315B can be a continuation of the system communication channel 320, such that wires in each of the connections are tapped, or spliced, from respective wires in the system communication channel 320.

Figure 4:
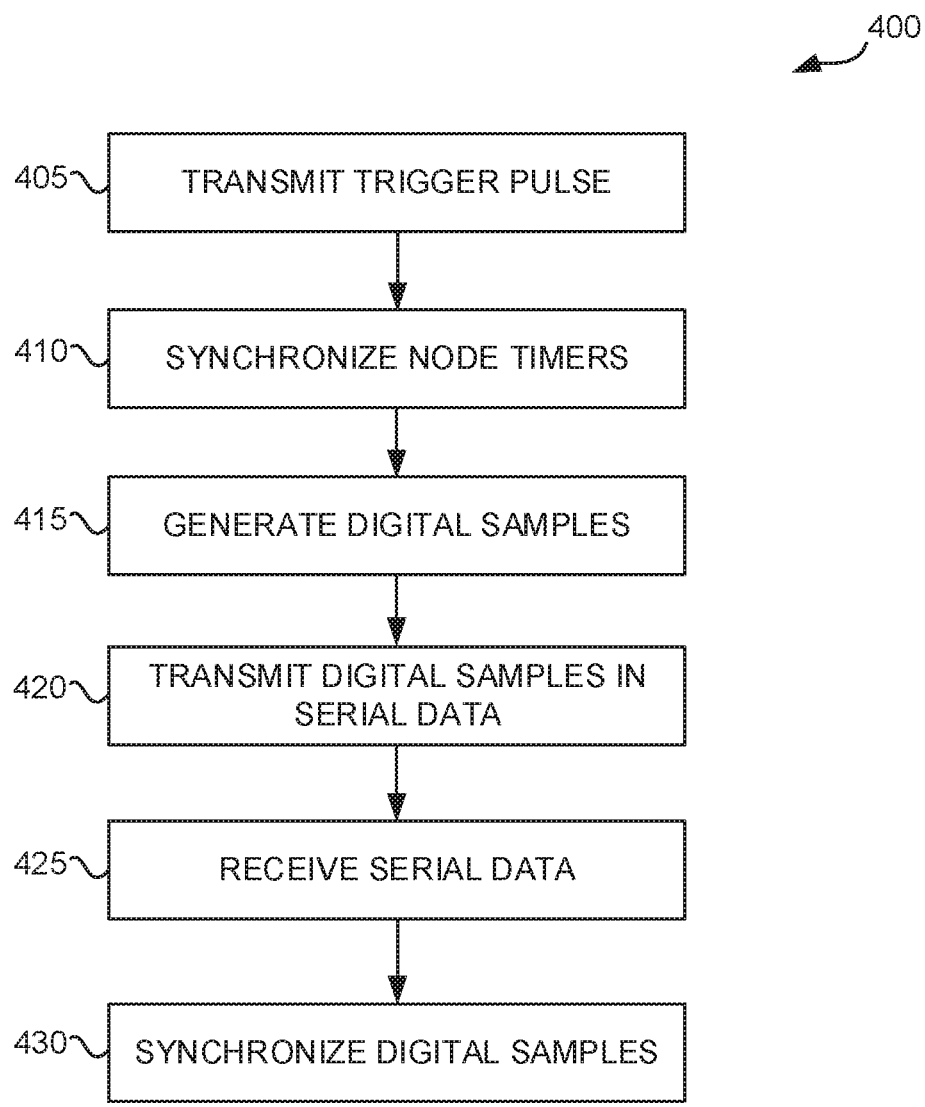
FIG. 4 depicts a set of operations for operating a control node of a system for synchronizing two or more analog to digital converter circuits.

FIG. 4 depicts a set of operations 400 for operating a control node of a system for synchronizing two or more analog to digital converters. The system can be an implementation of the system 200 (FIG. 2A) or the system 100 (FIG. 1). The operations 400 can be executed by a control node such as the control node 245 (FIG. 2A) or the control node 150 (FIG. 1). The control node can execute one or more of the operations 400. The control node can also directly or indirectly cause one or more other operations of the operations 400 to be executed by two or more sensing nodes, such as the sensing nodes 205 and 220 of FIG. 2A.

At operation 405, the control node can transmit a trigger pulse to two or more sensing nodes using a serial communication channel. Such transmitting can include loading a data value in a data register associated with a serial interface (e.g., a system communication interface) of the control node and causing the data value to be propagated along a transmit line of the serial communication channel. This can cause a change in an electrical state of the transmit line at receive pins of sensing nodes coupled to the transmit line, such as described herein.

At operation 410, the trigger pulse can cause each sensing node to synchronize an internal timer to the received trigger pulse, as described herein. Such synchronization can include storing a value associated with internal timers in a memory circuit of each sensing node. Such value can include a count or other indicator of the current state of the internal timer. Such value can also include another indicator derived from a count or other indicator of the current state of the internal timer. Synchronizing the internal timers can also include resetting the count or other indicator of the current state of the timer, such as to a specified count or state.

At operation 415, the sensing nodes can generate one or more digital samples of an analog signal using an associated ADC circuit, such as described herein. Each sensing node can generate digital samples of a different analog signal. The trigger pulse can initiate the synchronous generation of a first set of digital samples, while subsequent digital samples can be generated in response to one or more other processing events. Such generating can include configuring a DMA component of the sensing nodes to automatically cause the ADC circuits to generate one or more digital samples at a specified sample rate (e.g., a first sample rate), and to store generated digital samples in a memory storage circuit of the sensing nodes.

At operation 420, the sensing nodes can transmit the digital samples to the control node such as using the serial communication channel. Such transmitting can include decimating the digital samples to convert the data set's sample rate from a first sample rate to a second, lower, sample rate. Such transmitting can also include associating a timestamp with the decimated digital samples, such as to provide an indication of the time at which digital samples were captured. Such transmitting can also include causing the decimated digital samples and the associated time stamps to be transmitted to the control node over a receive wire of the serial communication channel.

At operation 425, the control node can receive the digital samples from the sensing nodes. At operation 430, the control node can synchronize the received digital samples, such as described herein.

Figure 5:
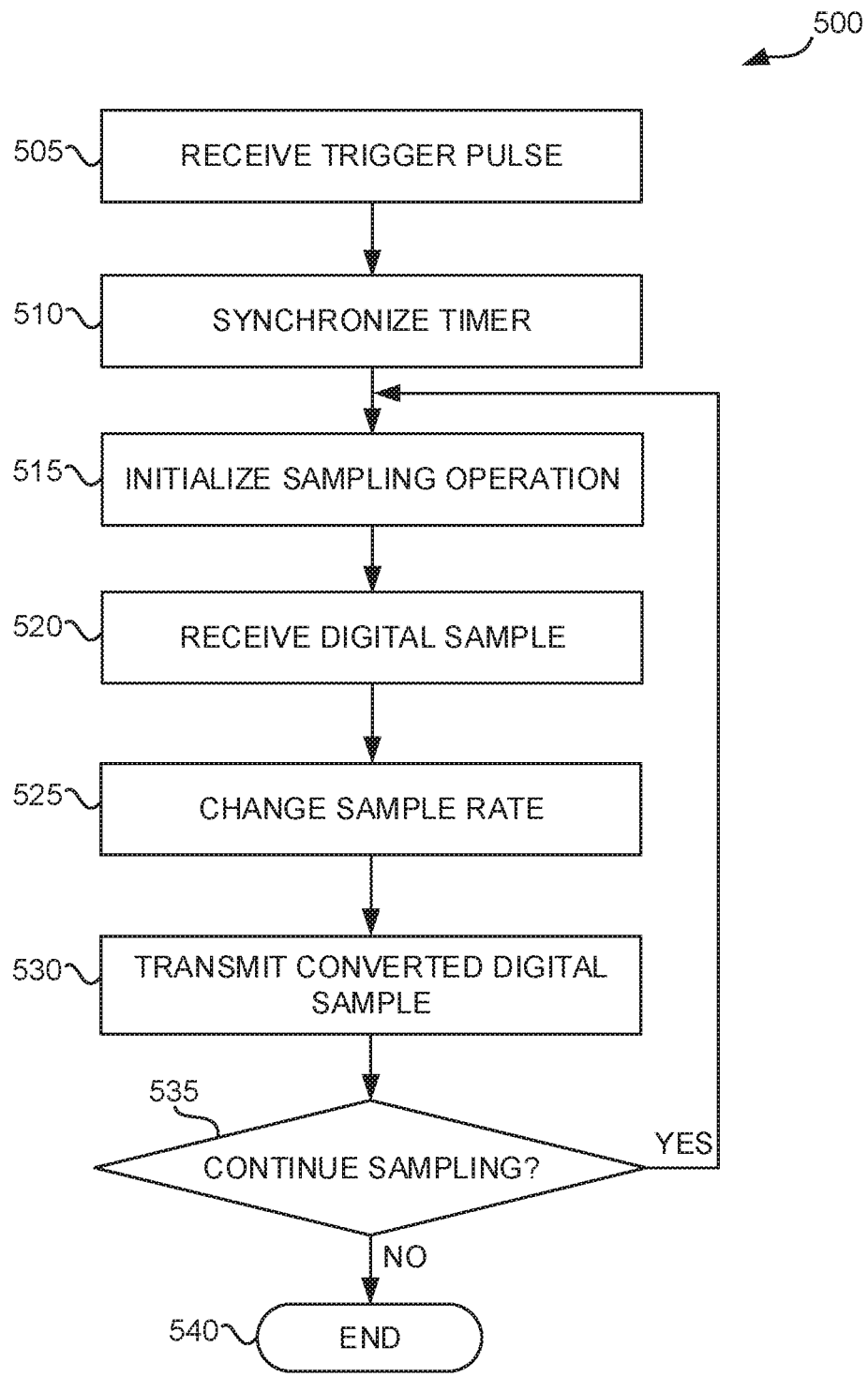
FIG. 5 depicts a set of operations for operating a sensing node of a system for synchronizing two or more analog to digital converters.

FIG. 5 depicts a set of operations 500 such as for operating a sensing node of a system for synchronizing two or more analog to digital converters. The system can be an implementation of the system 200 (FIG. 2A) or the system 100 (FIG. 1). The operations 500 can be executed by a sensing node such as the sensing node 205 or 220 of FIG. 2A. More specifically, the operations 500 can be executed by a processing circuit of a sensing node. At operation 505, the sensing node can receive a trigger pulse from a control node over a serial communication channel. The trigger pulse can initiate a processing event in a processing circuit of the sensing node to cause the sensing node to synchronize an internal timer with the trigger pulse, such as shown in operation 510.

The sensing node can then initialize a sampling operation, such as shown in operation 515. Such initializing can include configuring a DMA component (e.g., DMA component 120 of FIG. 1), a data serial port interface (e.g., data communication interface 115 of FIG. 1), and an ADC circuit (e.g., ADC circuit 135 of FIG. 1) associated with the sensing node to generate digital samples of an analog signal, such as described herein. The DMA component can be configured to automatically cause the ADC circuit to generate a specified number of digital samples of an analog signal. The DMA component can also be configured to automatically store the digital samples in specified memory circuits of the sensing node.

At operation 520, the sensing node can receive and store digital samples generated by the ADC circuit in one or more memory circuits. The sensing node can then decimate the digital samples to change the sample rate, as shown in operation 525. The sensing node can then transmit the decimated digital samples to the control node, as shown in operation 530.

At operation 535, the sensing node can determine whether to continue sampling the analog signal, such as by evaluating a specified criterion. The sensing node can continue the operations 500 at operation 515 in response to determining to continue sampling. Alternatively, the sensing node can terminate executing the operations 400 at operation 540 in response to determining to not continue sampling.

Figure 6:
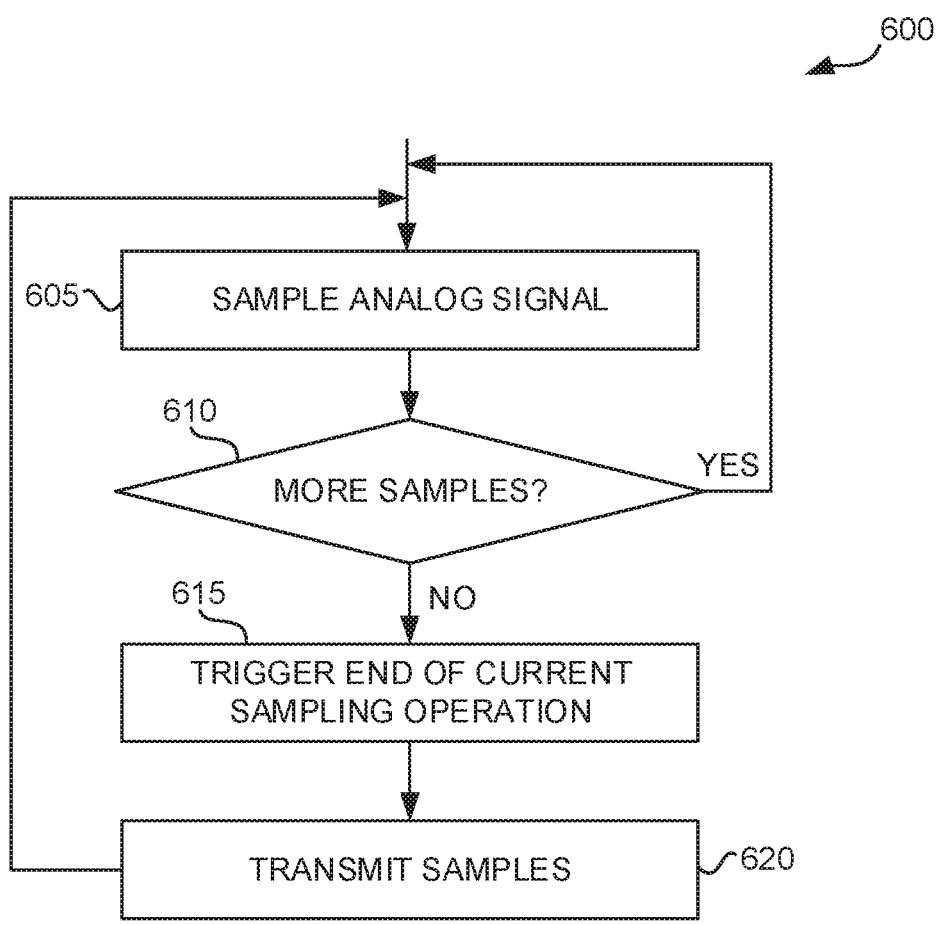
FIG. 6 depicts a set of operations for operating a sensing node in a system for synchronizing two or more analog to digital converter circuits.

FIG. 6 depicts a set of operations 600 for operating a sensing node in a system for synchronizing two or more analog to digital converters. The system can be an implementation of the system 200 (FIG. 2A) or the system 100 (FIG. 1). The operations 600 can be executed by a sensing node such as the sensing node 205 or 220 of FIG. 2A. More specifically, the operations 600 can be execute by a DMA component of the sensing node, such as the DMA component 120 (FIG. 1). The operations 600 can be executed after executing operation 515 (FIG. 5). The operations 600 can be executed in parallel with one or more of the operations 500.

At operation 605, the sensing node can generate a digital sample of an analog signal. Such generating can include transmitting a conversion pulse to an ADC circuit associated with the sensing node such as to cause the ADC circuit to generate the digital sample. The digital sample can then be automatically transmitted to, and stored in, a specified memory circuit of the sensing node. At operation 610 the sensing node can determine whether there are more samples to generate (e.g., the sensing node can determine whether as specified number of digital samples have not been generated). The sensing node can return to operation 605 when there are more digital samples to generate, while the sensing node can continue to operation 615 when there are no more digital samples to generate.

At operation 615 the sensing node can signal the end of the current sampling operation, such as by signaling the end of a DMA operation.

At operation 620, the sensing node can automatically restart another sampling operation, such as by starting a new DMA operation. Restarting another sampling operation can include adjusting for any drift in ADC sampling times depending on the trigger pulses received from the control node and a value of the timer count of the sensing node, such as by delaying or speeding up actuation of a control signal (e.g. EP_CNV) to cause the ADC circuit to generate digital samples, as described herein. This helps maintain the level of synchronization to within reasonable limits.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein," Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A system for synchronizing two or more analog to digital converter circuits, the system comprising:
   a first processing circuit comprising a first timer;
   a second processing circuit comprising a second timer; and
   a control circuit coupled to the first processing circuit and to the second processing circuit using a first electrical conductor to transmit data and a second electrical conductor to receive data, the control circuit to:
   transmit a trigger signal simultaneously to the first processing circuit and to the second processing circuit using the first electrical conductor to cause the first processing circuit and the second processing circuit to synchronize the first timer and the second timer, respectively, using the trigger signal,
   receive, using the second electrical conductor, first serial data from the first processing circuit, the first serial data comprising a first digital sample of an analog signal and a timestamp to indicate a time at which the digital sample was captured, the timestamp determined using a value of the first timer.

2. The system of claim 1, wherein the control circuit is further to:
   receive, using the second electrical conductor, second serial data from the second processing circuit, the second serial data comprising a second digital sample of an analog signal and a second timestamp to indicate a time at which the second digital sample was captured, the second timestamp determined using a value of the second timer;
   synchronize the first serial data with the second serial data using the first timestamp and the second timestamp.

3. The system of claim 1, wherein to synchronize the first time and the second timer is to cause the first processing circuit and the second processing circuit to store an initial timestamp in a memory storage circuit, the initial timestamp determined using a value of the first timer or a value of the second timer at a threshold time after receiving the trigger signal.

4. The system of claim 1, wherein to receive the first serial data is to cause the first processing circuit:
   trigger a first analog to digital converter circuit to convert a first sample of a first analog signal to the first digital sample, and
   receive the first digital sample from the first analog to digital converter circuit using a first sample communication channel.

5. The system of claim 4, wherein to receive the first serial data is to further cause the first processing circuit to:
   convert the first sample of the first analog signal to the first digital sample at a first sample rate, the first sample rate associated with a first data rate of the first sample communication channel;
   convert the first digital sample to a second sample rate, the second sample rate associated with a second data rate of the serial communication channel; and
   transmit the converted first digital sample to the control circuit using the second electrical conductor.

6. The system of claim 4, wherein the first processing circuit triggers the first analog to digital converter circuit asynchronously to the second processing circuit triggering a second analog to digital converter circuit.

7. The system of claim 1, wherein to transmit the trigger signal simultaneously to the first processing circuit and to the second processing circuit using the serial communication is to:
   transmit the trigger signal using a transmit circuit coupled to the first electrical conductor, the transmit circuit being coupled to an input port of each of the first processing circuit and the second processing circuit, the input port being configured to generate a processor interrupt in response to receiving the trigger signal, each of the first processing circuit and the second processing circuit being configured to trigger an analog to digital converter circuit to convert a sample of the analog signal to a digital sample in response to the processor interrupt.

8. A system for synchronizing two or more analog to digital converter circuits using a data transmit electrical conductor of a serial communication channel and a data receive electrical conductor of the serial communication channel, the system comprising:
   two or more electrode pods, each of the two or more electrode pods comprising a first processing circuit and an analog to digital converter circuit, the first processing circuit configured to:
   receive, on the data transmit electrical conductor, a trigger signal from a data transmit circuit of a the serial communication channel,
   synchronize a counter after receiving the trigger signal, the counter being internal to each of the two or more electrode pods,
   generate, using the analog to digital converter circuit, one or more digital samples of an analog signal,
   generate at least one timestamp to indicate a time at which the one or more digital samples were generated, the at least one timestamp determined using at least one value of the counter,
   transmit the one or more digital samples and the at least one timestamp to the serial communication channel; and
   a belt unit comprising a second processing circuit, the second processing circuit to:
   transmit, on the data transmit electrical conductor, the trigger signal to the two or more electrode pods,
   receive, on the data receive electrical conductor after transmitting the trigger signal, the one or more digital samples and the at least one timestamp from the two or more electrode pods, and
   synchronize the received one or more digital samples using the at least one timestamp.

9. The system of claim 8, wherein the data transmit electrical conductor is coupled to a received port of the first processing circuit of each of the two or more electrode pods, and wherein to receive the trigger signal is to trigger an interrupt in the first processing circuit.

10. The system of claim 9, wherein the data transmit electrical conductor is coupled to the transmit port of the second processing circuit; and wherein to transmit the trigger signal is to cause the first processing circuit of each of the two or more electrode pods to receive the trigger signal within a threshold time.

11. The system of claim 8, wherein to synchronize the counter after receiving the trigger signal is to store a value associated with the counter in a memory storage circuit of the first processing circuit of each of the two or more electrode pods, wherein the value is determined based on a state of the counter within a threshold time after the first processing circuit receives the trigger signal.

12. The system of claim 8, wherein to generate the one or more digital samples of the analog signal is to:
   trigger the analog to digital converter circuit to convert a sample of the analog signal to a digital sample, and
   receive the digital sample from the analog to digital converter circuit using a sample communication channel, the sample communication channel coupling the first processing circuit to the analog to digital converter circuit.

13. The system of claim 12, wherein the first processing circuit of each electrode pod of the two or more electrode pods is configured to trigger the analog to digital converter circuit of the each electrode pod two or more times after receiving the trigger signal to convert the sample of the analog signal to the digital sample.

14. The system of claim 12, wherein each electrode pod of the two or more electrode pods includes at least one electrode to detect the analog signal and to provide the sample of the analog signal to the analog to digital converter circuit.

15. A method of synchronizing two or more analog to digital converter circuits using a data transmit electrical conductor of a serial communication channel and a data receive electrical conductor of the serial communication channel, the method comprising:
   transmitting a trigger signal to a first processing circuit and to a second processing circuit using the data transmit electrical conductor, the trigger signal configured to:
      cause the first processing circuit to synchronize a first counter in the first processing circuit to the trigger signal,
      cause the second processing circuit to synchronize a second counter in the second processing circuit to the trigger signal,
      cause the first processing circuit and the second processing circuit to generate one or more digital samples of and analog signal and transmit serial data to the control circuit using the data receive electrical conductor, the serial data comprising the one or more digital samples and at least one timestamp comprising data indicative of a time at which the one or more digital samples were generated, the at least one timestamp determined using a value of the first counter or a value of the second counter;
   receiving, after transmitting the trigger signal, the serial data transmitted by the first processing circuit and the second processing circuit; and
   synchronizing a first part of the serial data with a second part of the serial data using the at least one timestamp, the first part of the serial data being received from the first processing circuit, and the second part of the serial data being received from the second processing circuit.

16. The method of claim 15, wherein synchronizing the first counter in the first processing circuit to the trigger signal comprises causing the first processing circuit store an initial timestamp in a memory storage circuit, the initial timestamp determined using a value of the first counter at a threshold time after the first processing circuit receives the trigger signal.

17. The method of claim 15, wherein causing the first processing circuit and the second processing circuit to generate the one or more digital samples comprises:
   causing the first processing circuit to:
      trigger a first analog to digital converter circuit to convert a first sample of a first analog signal to a first digital sample, and
      receive the first digital sample from the first analog to digital converter circuit using a first sample communication channel; and
   causing the second processing circuit to:
      trigger a second analog to digital converter circuit to convert a second sample of a second analog signal to a second digital sample, and
      receive the second digital sample from the second analog to digital converter circuit using a second sample communication channel.

18. The method of claim 17, wherein:
   the first analog to digital converter circuit converts the first sample of the first analog signal to the first digital sample at a first sample rate, the first sample rate being associated with a first data rate of the first sample communication channel; and
   causing the first processing circuit and the second processing circuit to transmit serial data to the control circuit using the data receive electrical conductor comprises causing the first processing circuit to convert the first digital sample to a second sample rate, the second sample rate being associated with a second data rate of the serial communication channel.

19. The method of claim 17, wherein the first processing circuit triggers the first analog to digital converter circuit asynchronously to the second processing circuit triggering the second analog to digital converter circuit.

20. The method of claim 17, wherein causing the first processing circuit and the second processing circuit to generate the one or more digital samples in response to receiving the trigger signal further comprises:
   causing the first processing circuit to:
   determine whether the value of the first counter is different from an expected value of the first counter, and
   delaying, in response to determining that the value of the first counter is different from an expected value of the first counter, the triggering of the first analog to digital converter circuit for a time period determined by a difference between the value of the first counter and the expected value of the first counter.

* * * * *